United States Patent
Luo et al.

(10) Patent No.: US 7,199,037 B2
(45) Date of Patent: Apr. 3, 2007

(54) MICROFEATURE DEVICES AND METHODS FOR MANUFACTURING MICROFEATURE DEVICES

(75) Inventors: Shijian Luo, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/413,682

(22) Filed: Apr. 27, 2006

(65) Prior Publication Data

US 2006/0194424 A1    Aug. 31, 2006

Related U.S. Application Data

(62) Division of application No. 10/867,023, filed on Jun. 14, 2004.

(51) Int. Cl.
*H01L 21/44* (2006.01)

(52) U.S. Cl. .............. 438/614; 257/E21.508; 257/E21.511; 438/613

(58) Field of Classification Search .......... 438/613, 438/614
See application file for complete search history.

(56) References Cited

U.S. PATENT DOCUMENTS

| | | | |
|---|---|---|---|
| 5,252,857 A | 10/1993 | Kane et al. | |
| 5,641,113 A * | 6/1997 | Somaki et al. | 228/180.22 |
| 5,677,566 A | 10/1997 | King et al. | |
| 5,739,050 A | 4/1998 | Farnworth | |
| 5,815,000 A | 9/1998 | Farnworth et al. | |
| 5,894,218 A | 4/1999 | Farnworth et al. | |
| 5,925,930 A | 7/1999 | Farnworth et al. | |
| 5,933,713 A | 8/1999 | Farnworth | |
| 6,018,249 A | 1/2000 | Akram et al. | |
| 6,025,728 A | 2/2000 | Hembree et al. | |
| 6,048,744 A | 4/2000 | Corisis et al. | |
| 6,048,755 A | 4/2000 | Jiang et al. | |
| 6,072,233 A | 6/2000 | Corisis et al. | |
| 6,072,323 A | 6/2000 | Hembree et al. | |
| 6,081,429 A | 6/2000 | Barrett | |
| 6,094,058 A | 7/2000 | Hembree et al. | |
| 6,097,087 A | 8/2000 | Farnworth et al. | |
| 6,107,122 A | 8/2000 | Wood et al. | |
| 6,150,717 A | 11/2000 | Wood et al. | |
| 6,163,956 A | 12/2000 | Corisis | |

(Continued)

OTHER PUBLICATIONS

U.S. Appl. No. 11/407,435, filed Apr. 20, 2006, Luo et al.

(Continued)

*Primary Examiner*—David A. Zarneke
(74) *Attorney, Agent, or Firm*—Perkins Coie LLP

(57) ABSTRACT

Microfeature devices, microfeature workpieces, and methods for manufacturing microfeature devices and microfeature workpieces are disclosed herein. The microfeature workpieces have an integrated circuit, a surface, and a plurality of interconnect elements projecting from the surface and arranged in arrays on the surface. In one embodiment, a method includes forming a coating on the interconnect elements of the microfeature workpiece, producing a layer over the surface of the microfeature workpiece after forming the coating, and removing the coating from at least a portion of the individual interconnect elements. The coating has a surface tension less than a surface tension of the interconnect elements to reduce the extent to which the material in the layer wicks up the interconnect elements and produces a fillet at the base of the individual interconnect elements.

20 Claims, 8 Drawing Sheets

U.S. PATENT DOCUMENTS

| | | | |
|---|---|---|---|
| 6,188,232 B1 | 2/2001 | Akram et al. | |
| 6,198,172 B1 | 3/2001 | King et al. | |
| 6,208,156 B1 | 3/2001 | Hembree | |
| 6,247,629 B1 | 6/2001 | Jacobson et al. | |
| 6,255,833 B1 | 7/2001 | Akram et al. | |
| 6,281,046 B1 | 8/2001 | Lam | |
| 6,281,577 B1 | 8/2001 | Oppermann et al. | |
| 6,285,204 B1 | 9/2001 | Farnworth | |
| 6,294,839 B1 | 9/2001 | Mess et al. | |
| 6,310,390 B1 | 10/2001 | Moden | |
| 6,329,222 B1 | 12/2001 | Corisis et al. | |
| 6,437,586 B1 | 8/2002 | Robinson | |
| 6,506,671 B1 * | 1/2003 | Grigg | 438/612 |
| 6,518,677 B1 | 2/2003 | Capote et al. | |
| 6,525,408 B2 * | 2/2003 | Akram et al. | 257/668 |
| 6,528,894 B1 * | 3/2003 | Akram et al. | 257/788 |
| 6,552,910 B1 | 4/2003 | Moon et al. | |
| 6,560,117 B2 | 5/2003 | Moon | |
| 6,569,753 B1 * | 5/2003 | Akram et al. | 438/612 |
| 6,712,260 B1 * | 3/2004 | Kuo et al. | 228/180.22 |
| 6,809,020 B2 * | 10/2004 | Sakurai et al. | 438/613 |
| 6,818,544 B2 * | 11/2004 | Eichelberger et al. | 438/613 |
| 6,887,778 B2 * | 5/2005 | Watanabe et al. | 438/613 |
| 6,902,995 B2 * | 6/2005 | Grigg | 438/612 |
| 6,955,982 B2 * | 10/2005 | Jimarez et al. | 438/616 |
| 6,972,249 B2 * | 12/2005 | Akram et al. | 438/613 |
| 7,008,867 B2 * | 3/2006 | Lei | 438/613 |
| 7,041,589 B2 * | 5/2006 | Lay et al. | 438/613 |
| 7,075,184 B2 * | 7/2006 | Hashimoto | 257/773 |
| 7,101,782 B2 * | 9/2006 | Gosselin et al. | 438/612 |
| 7,122,460 B2 * | 10/2006 | Hua | 438/614 |
| 7,122,896 B2 * | 10/2006 | Saito et al. | 257/738 |
| 2003/0127502 A1 | 7/2003 | Alvarez | |
| 2005/0277279 A1 | 12/2005 | Luo et al. | |

OTHER PUBLICATIONS

Unitive Advanced Semiconductor Packaging, Design Guidelines, pp. 1-18, 2001, <http://www.unitive.com>.

* cited by examiner

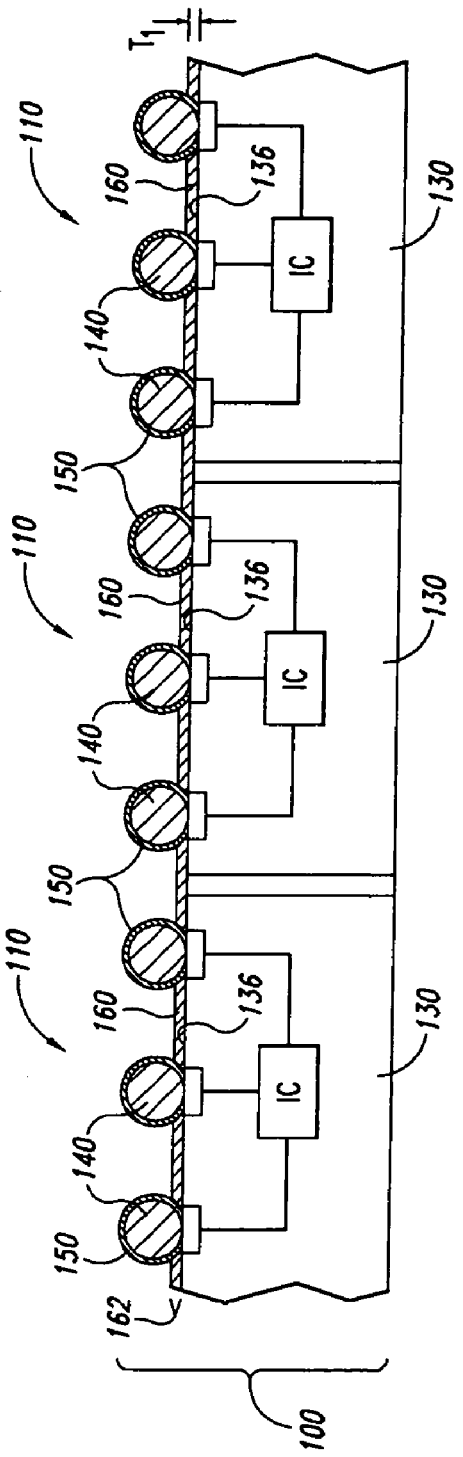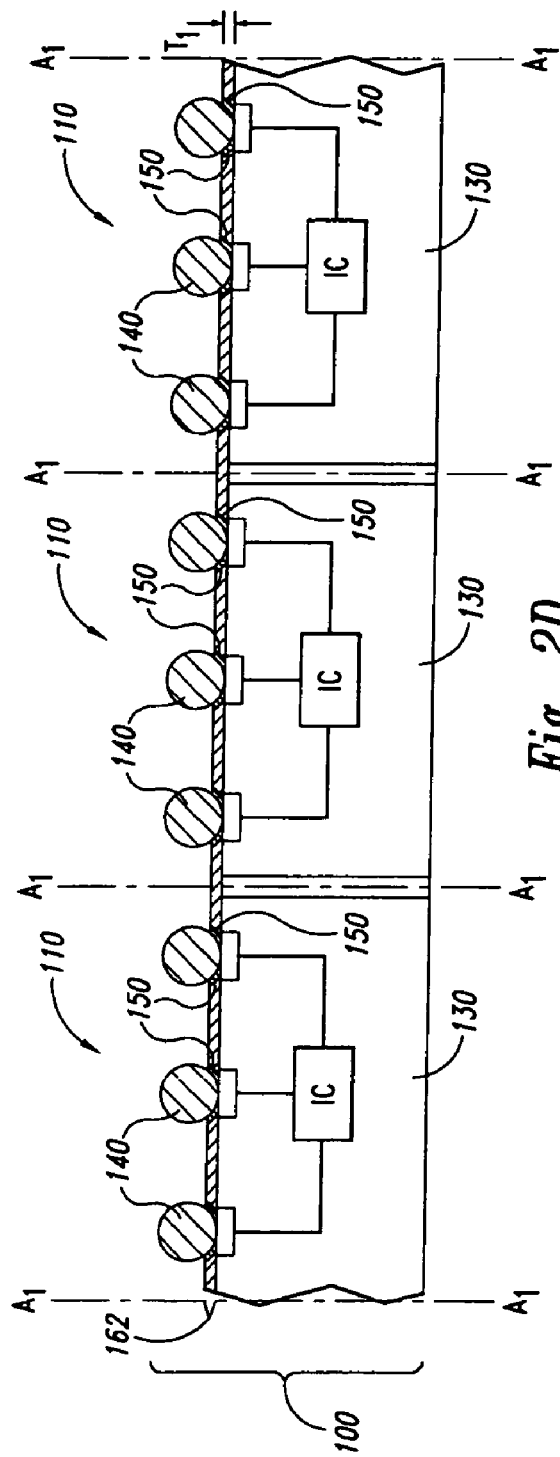

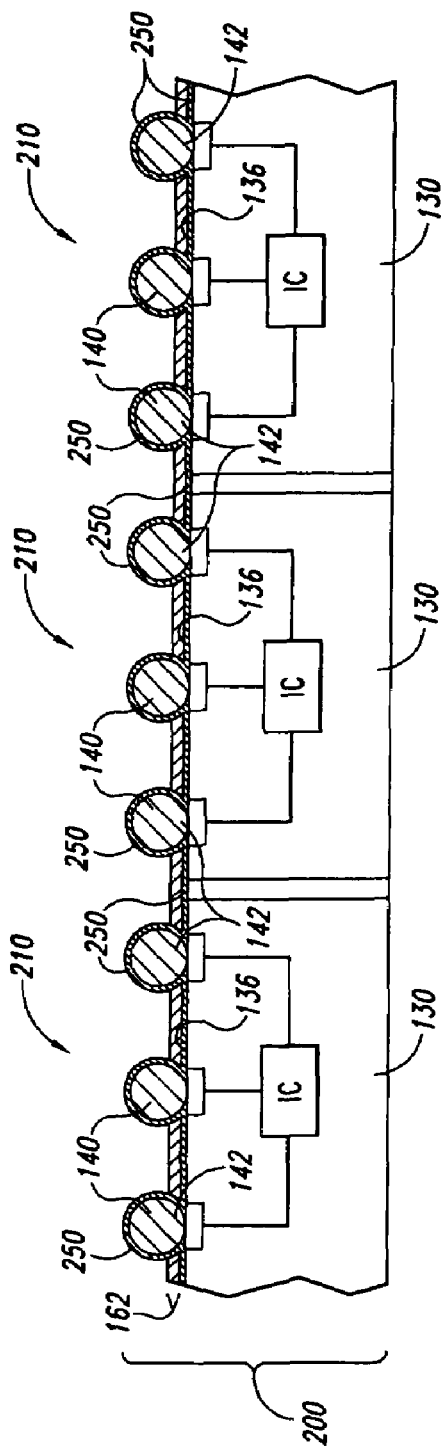
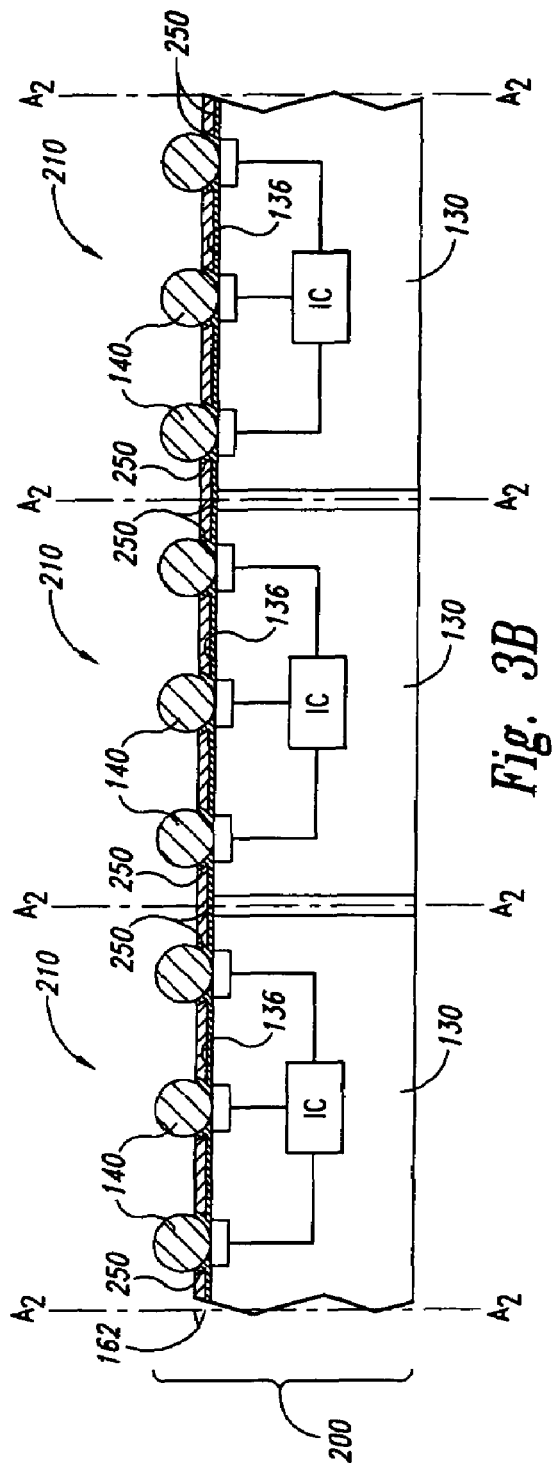

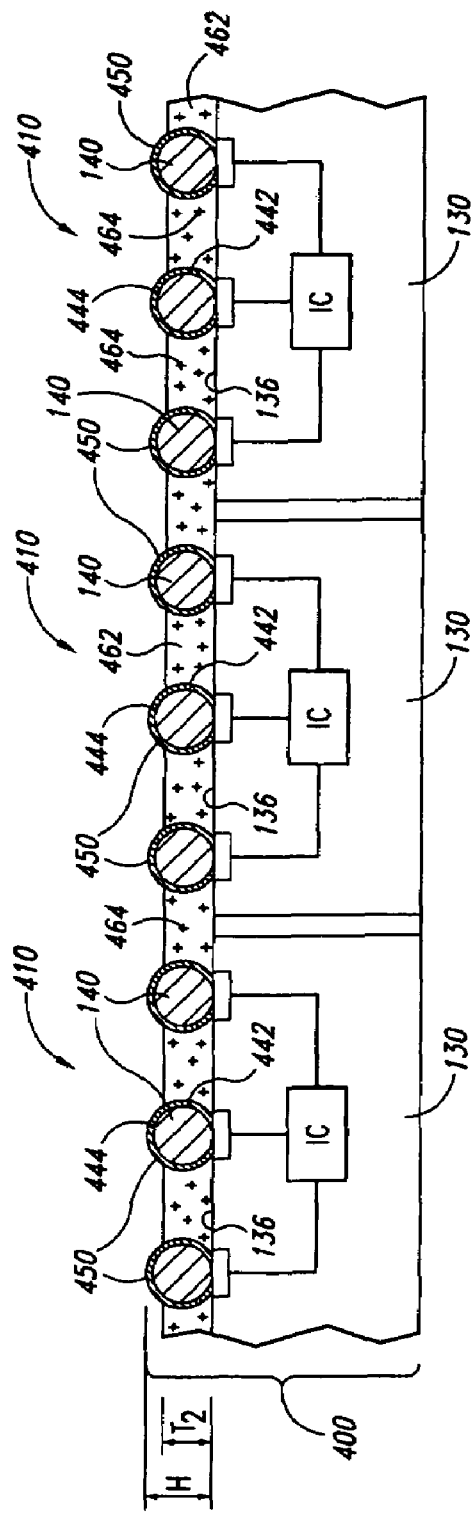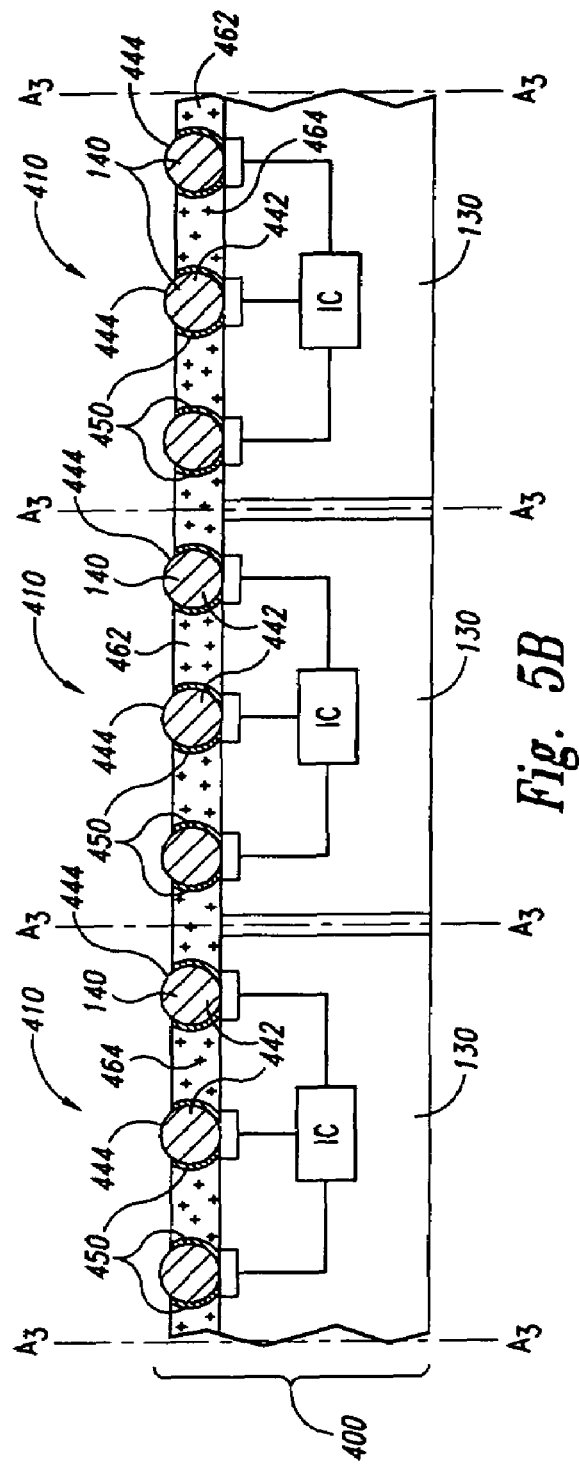
Fig. 5A
Fig. 5B

MICROFEATURE DEVICES AND METHODS FOR MANUFACTURING MICROFEATURE DEVICES

CROSS-REFERENCE TO RELATED APPLICATION

This application is a divisional of U.S. patent application Ser. No. 10/867,023, filed Jun. 14, 2004, which is incorporated herein by reference in its entirety. This application is related to U.S. patent application Ser. No. 11/407,435, filed Apr. 20, 2006 entitled "MICROFEATURE DEVICES AND METHODS FOR MANUFACTURING MICROFEATURE DEVICES."

TECHNICAL FIELD

The present invention is related to microfeature devices and methods for manufacturing microfeature devices.

BACKGROUND

Conventional microelectronic devices are manufactured for specific performance characteristics required for use in a wide range of electronic equipment. A microelectronic bare die, for example, includes an integrated circuit and a plurality of bond-pads electrically coupled to the integrated circuit. The bond-pads can be arranged in an array, and a plurality of solder balls can be attached to corresponding bond-pads to construct a "ball-grid array." Conventional bare dies with ball-grid arrays generally have solder balls arranged, for example, in 6×9, 6×10, 6×12, 6×15, 6×16, 8×12, 8×14, or 8×16 patterns, but other patterns are also used.

Bare dies are generally tested in a post-production batch process to determine which dies are defective. To protect the dies during testing and other post-production processes, a protective coating is formed over the surface and/or edges of the dies. One drawback of forming the protective coating on conventional dies is that the coating material can interfere with the connection between the solder balls and the contacts of a testing device and, accordingly, result in false negative tests and the loss of good dies. Thus, there is a need to improve the process of forming the protective coating on bare dies.

In other applications, bare dies and various other packaged dies can include an underfill layer across the surface of the dies to (a) protect the dies from moisture, chemicals, and other contaminants, and (b) enhance the integrity of the joint between the individual dies and the corresponding substrates to which the dies are subsequently attached. The underfill layer can be formed on the die before the die is attached to the substrate, and the layer typically has a thickness of between approximately 70 and 90 percent of the height of the solder balls on the die.

One drawback of conventional processes for depositing underfill across the die is that the underfill material also wicks up and may cover the top of the solder balls. Consequently, the underfill typically does not include dielectric filler particles because if the particles were to become trapped on the tops of the solder balls, the particles would impair the subsequent electrical connection between the die and the substrate. It is, however, desirable to use underfill with filler particles because the particles increase the rigidity of the underfill to provide a more robust package. Accordingly, there is also a need to improve the process of depositing underfill material on dies.

BRIEF DESCRIPTION OF THE DRAWINGS

FIGS. 2A–2E illustrate stages in a method of manufacturing a plurality of microfeature devices in accordance with one embodiment of the invention.

FIG. 2A is a schematic side cross-sectional view of a microfeature workpiece after forming a coating on a plurality of conductive balls.

FIG. 2B is a top plan view of the microfeature workpiece after depositing protective material across a plurality of dies.

FIG. 2C is a schematic side cross-sectional view of the microfeature workpiece after forming a protective layer across the dies.

FIG. 2D is a schematic side cross-sectional view of the microfeature workpiece after removing a portion of the coating from the individual conductive balls.

FIG. 2E is a schematic side cross-sectional view of one of the microfeature devices during testing.

FIGS. 3A and 3B illustrate stages in a method of manufacturing a plurality of microfeature devices on a microfeature workpiece in accordance with another embodiment of the invention.

FIG. 3A is a schematic side cross-sectional view of the microfeature workpiece including a coating extending across the workpiece.

FIG. 3B is a schematic side cross-sectional view of the microfeature workpiece after removing the coating from a portion of the conductive balls.

FIG. 4A is a schematic side cross-sectional view of the microfeature workpiece and a plurality of sockets for forming a coating on the conductive balls.

FIG. 4B is a schematic side cross-sectional view of the microfeature workpiece after forming the coating on the conductive balls.

FIGS. 5A and 5B illustrate stages in a method of manufacturing a plurality of microfeature devices in accordance with another embodiment of the invention.

FIG. 5A is a schematic side cross-sectional view of a microfeature workpiece having an underfill layer extending across the dies.

FIG. 5B is a schematic side cross-sectional view of the microfeature workpiece after removing a coating from a distal portion of the conductive balls.

DETAILED DESCRIPTION

A. Overview

The following disclosure is directed to microfeature devices, microfeature workpieces, and methods for manufacturing microfeature devices and microfeature workpieces. The term "microfeature workpiece" is used throughout to include substrates in and/or on which microelectronic devices, micromechanical devices, data storage elements, and other features are fabricated. For example, microfeature workpieces can be semiconductor wafers, glass substrates, insulated substrates, or many other types of substrates. The term "microfeature device" is used throughout to include microelectronic devices, micromechanical devices, data storage elements, read/write components, and other articles of manufacture. For example, microfeature devices include SIMM, DRAM, flash-memory, ASICS, processors, flip chips, ball-grid array chips, and other types of electronic devices or components. Several specific details of the invention are set forth in the following description and in FIGS. 1–6 to provide a thorough understanding of certain embodiments of the invention. One skilled in the art, however, will understand that the present invention may have additional embodiments and that the embodiments of the invention may be practiced without several of the specific features described below.

Figure 1:
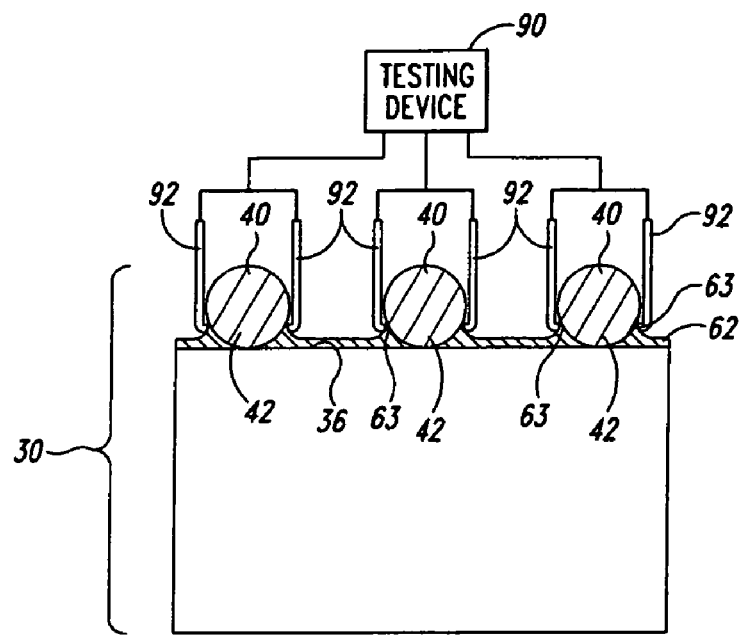
FIG. 1 is a schematic side cross-sectional view of a bare die with a testing device.

FIG. 1 is a schematic side cross-sectional view of a bare die 30 and a testing device 90. The die 30 includes a surface 36, a plurality of solder balls 40 on the surface 36, and a protective coating 62 on the surface 36. The testing device 90 includes a plurality of test contacts 92 for applying signals to a proximal portion 42 of the solder balls 40 to test the die 30. The protective coating 62 wicks up the solder balls 40 and forms fillets 63 that cover the proximal portion 42 of the solder balls 40. The fillets 63 can prevent the test contacts 92 from contacting the solder balls 40, causing the die 30 to fail the test even though the die 30 functions properly. The protective coating 62 can accordingly result in false negative tests and the loss of good dies.

Several aspects of the invention are directed toward methods of forming protective layers on microfeature workpieces that reduce the false negative tests and loss of good dies described above. The microfeature workpieces have an integrated circuit, a surface, and a plurality of conductive interconnect elements projecting from the surface and arranged in arrays on the surface. For example, the interconnect elements can be solder balls or other conductive balls. In one embodiment, a method includes forming a coating on the interconnect elements of the microfeature workpiece, producing a layer over the surface of the microfeature workpiece after forming the coating, and removing the coating from at least a portion of the individual interconnect elements. The coating has a surface tension less than a surface tension of the interconnect elements to reduce the extent to which the material in the layer wicks up the interconnect elements. The layer can be an underfill layer or a protective layer and have a surface tension greater than the surface tension of the coating.

Another aspect of the invention is directed to methods for manufacturing microfeature devices. The microfeature devices can have a surface and a plurality of conductive balls on the surface. In one embodiment, a method includes coating only a proximal portion of the conductive balls of the microfeature device with a film having a surface tension less than the surface tension of the conductive balls, without coating a distal portion of the conductive balls with the film. The method further includes forming a layer over the surface of the microfeature device after coating the proximal portion of the conductive balls.

In another embodiment, a method includes providing a microfeature workpiece having a surface and a plurality of conductive ball arrays on the surface, forming a sacrificial coating on the conductive balls of the microfeature workpiece, and producing a layer over the surface of the microfeature workpiece after forming the sacrificial coating. The sacrificial coating has a surface tension less than the surface tension of the conductive balls. The method further includes removing the sacrificial coating from a distal portion of the individual conductive balls, cutting the microfeature workpiece to singulate a plurality of microfeature devices, and testing one of the microfeature devices by contacting the proximal portion of the corresponding conductive balls with test contacts.

Another aspect of the invention is directed to microfeature devices. In one embodiment, a microfeature device includes a die having an integrated circuit and a plurality of bond-pads electrically coupled to the integrated circuit. The device further includes a plurality of interconnect elements projecting from the die and electrically coupled to corresponding bond-pads. The device further includes a sacrificial coating on at least a portion of the individual interconnect elements and a layer over the die proximate to the interconnect elements. The sacrificial coating has a first surface tension and the interconnect elements have a second surface tension greater than the first surface tension.

B. Embodiments of Methods for Manufacturing Microfeature Devices

Figure 2A:
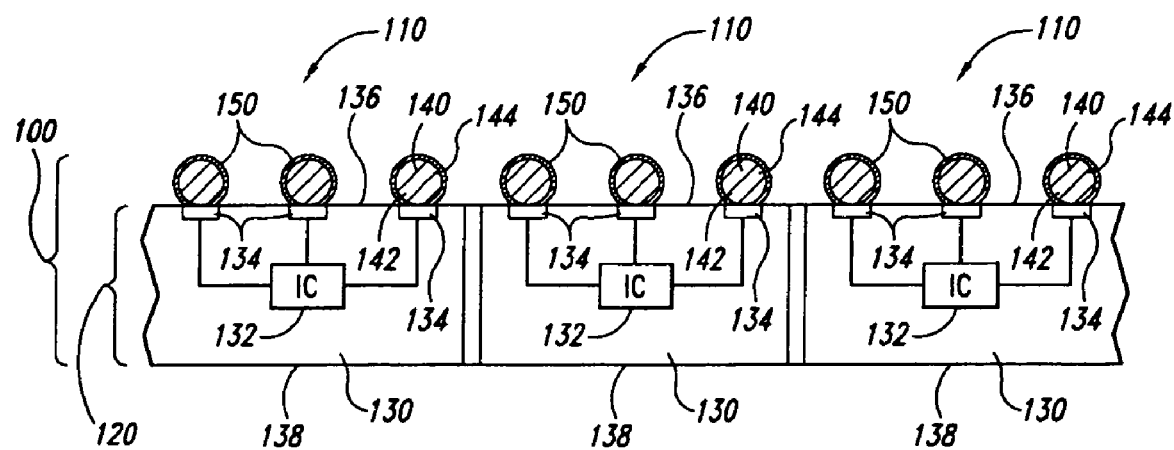

FIGS. 2A–2E illustrate stages in a method of manufacturing a plurality of microfeature devices 110 in accordance with one embodiment of the invention. FIG. 2A, more specifically, is a schematic side cross-sectional view of a microfeature workpiece 100 including a substrate 120 and a plurality of microelectronic dies 130 formed in and/or on the substrate 120. In the illustrated embodiment, the individual dies 130 include an integrated circuit 132 (shown schematically), an array of bond-pads 134 electrically coupled to the integrated circuit 132, a first surface 136, and a second surface 138 opposite the first surface 136. The microfeature workpiece 100 further includes a plurality of conductive balls 140 arranged in arrays and attached to corresponding bond-pads 134 of the dies 130. The conductive balls 140 can be solder balls or other conductive elements to provide external electrical contacts for the bond-pads 134 of the dies 130. In other embodiments, the microfeature workpiece 100 may not include multiple microelectronic dies 130. For example, the microelectronic workpiece 100 can be a single die, a circuit board, or another substrate with a plurality of conductive ball arrays.

After forming the conductive balls 140 on the bond-pads 134, a coating 150 is formed on the conductive balls 140 to inhibit protective layers, underfill layers, or other materials from wicking up the balls 140 in subsequent procedures. In the illustrated embodiment, the coating 150 has a first surface tension and the conductive balls 140 have a second surface tension greater than the first surface tension. As such, when another material is subsequently deposited onto the first surface 136 of the dies 130, the coating 150 inhibits the material from wicking up the conductive balls 140. More specifically, because the surface tension of the coating 150 is less than the surface tension of the conductive balls 140, the coating 150 reduces the distance that the material wicks up the conductive balls 140.

In the illustrated embodiment, the coating 150 encases the individual conductive balls 140 such that a proximal portion 142 and a distal portion 144 of the balls 140 are covered by the coating 150. In other embodiments, such as those described below with reference to FIGS. 4A and 4B, the coating 150 may not completely encase the conductive balls 140, but rather may cover only a proximal portion of the individual balls 140. The coating 150 may also cover a portion or all of the first surface 136 of the dies 130. For example, in the embodiments described below with reference to FIGS. 3A and 3B, the coating 150 covers all of the first surface 136 of the dies 130.

The coating 150 can be a sacrificial thin film or monolayer that is formed on the conductive balls 140 by spraying, dipping, vapor deposition, or other suitable processes. For example, in one process, a portion of the individual conductive balls 140 can be dipped into a bath containing the coating material such that the surface tension of the undipped portion of the balls 140 pulls the coating material over the entire surface of the balls 140 to encase the balls 140. Suitable coating materials include Silane solutions, such as Silquest A-1110, Silquest A-171, and Silquest A-187, manufactured by OSi Specialists in South Charleston, W. Va. The coating 150 can alternatively include other polymeric materials having a lower surface tension than the conductive balls 140. After the coating 150 is formed on the conductive balls 140, the microfeature workpiece 100 can optionally be heated to at least partially cure (e.g., B-stage) the coating 150.

Figure 2B:
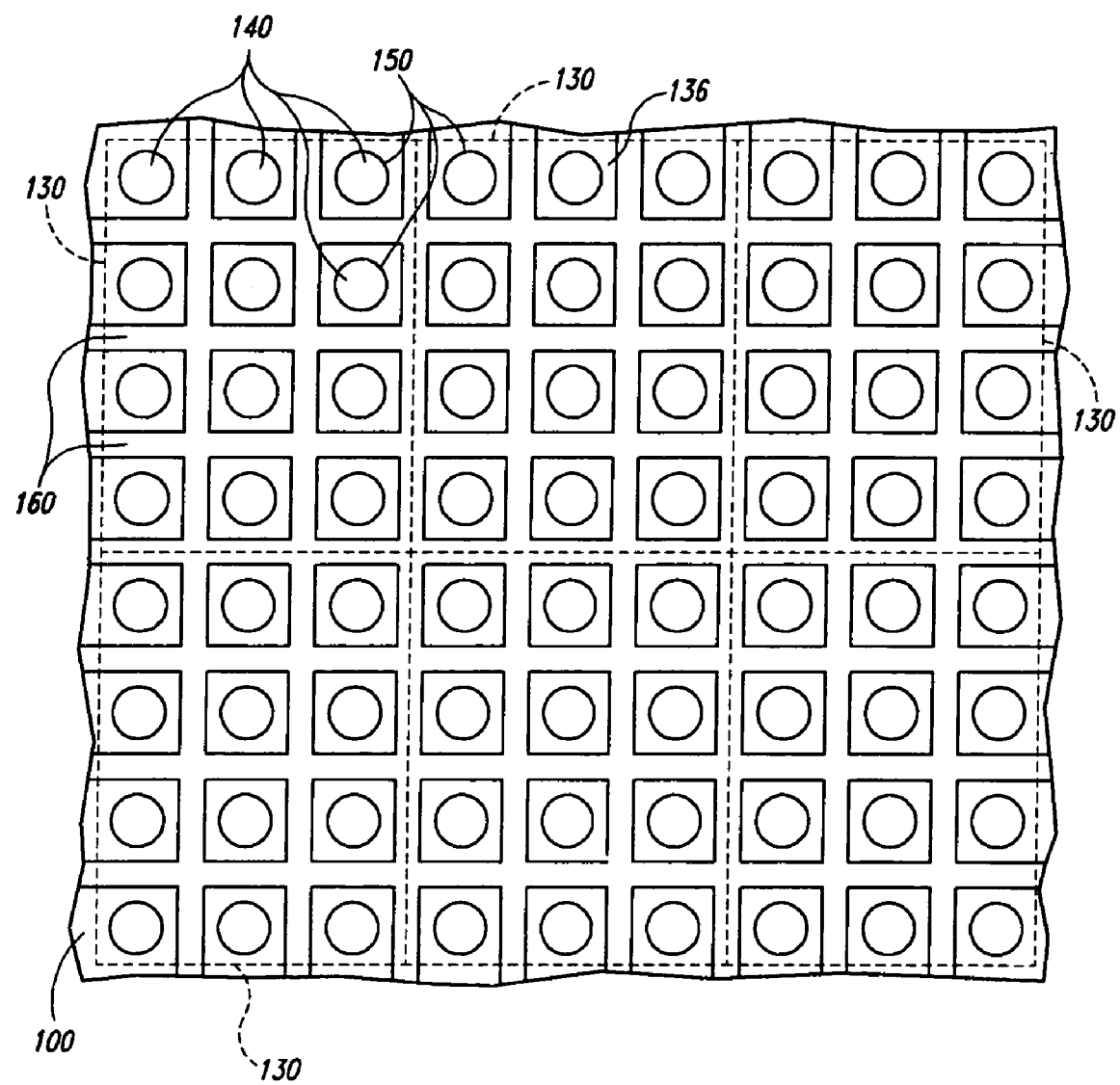

FIG. 2B is a top plan view of the microfeature workpiece 100 with beads of protective material 160 deposited in a grid across the first surface 136 of the dies 130. After forming the coating 150, the protective material 160 can be dispensed onto the first surface 136 of the dies 130 between the conductive balls 140. The protective material 160 subsequently flows laterally across the first surface 136 and toward the conductive balls 140 to form a generally uniform coating or protective layer 162 (shown in FIG. 2C) on the microfeature workpiece 100. Alternatively, the protective layer 162 can be formed on the workpiece 100 by spin coating or other suitable processes.

FIG. 2C is a schematic side cross-sectional view of the microfeature workpiece 100 after forming the protective layer 162 across the first surface 136 of the dies 130. The protective layer 162 protects the delicate internal components on the front side of the microfeature devices 110 during singulation, testing, and other production processes. The protective layer 162 can have a generally uniform thickness $T_1$ across the microfeature workpiece 100. In the illustrated embodiment, the thickness $T_1$ can be from approximately 5 microns to approximately 30 microns; however, in other embodiments, the thickness $T_1$ can be less than 5 microns or greater than 30 microns.

The protective material 160 may have a surface tension that is less than or greater than the surface tension of the coating 150. In either case, because the surface tension of the coating 150 is less than the surface tension of the conductive balls 140, the coating 150 reduces wicking of the protective material 160 up the conductive balls 140 compared to the extent that the material 160 would wick up the balls 140 without the coating 150. The coating 150 accordingly reduces the fillet height of the material 160 to reduce interference with the subsequent testing of the microfeature devices 110, as described below. The surface tension of the coating 150 is preferably less than the surface tension of the protective material 160 to further reduce the distance that the material 160 wicks up the conductive balls 140. After forming the protective layer 162 on the microfeature workpiece 100, the workpiece 100 can be heated to at least partially cure (e.g., B-stage) the coating 150 and the protective layer 162.

FIG. 2D is a schematic side cross-sectional view of the microfeature workpiece 100 with a portion of the coating 150 removed from the individual conductive balls 140. After the protective layer 162 is formed across the microfeature workpiece 100, the coating 150 on the portion of the conductive balls 140 projecting from the protective layer 162 is removed to expose the surface of the balls 140 for subsequent testing and/or attachment to a corresponding substrate or other external device. The coating 150 can be removed from the balls 140 via wet etching, plasma etching, or other suitable processes without significantly reducing the thickness $T_1$ of the protective layer 162 on the dies 130. For example, the coating 150 can be removed from the conductive balls 140 with a plasma having 95 percent $O_2$ and 5 percent $CF_4$. Before or after removing the portion of the coating 150, the microfeature workpiece 100 can be cut along the lines $A_1$—$A_1$ to singulate the microfeature devices 110.

Figure 2E:
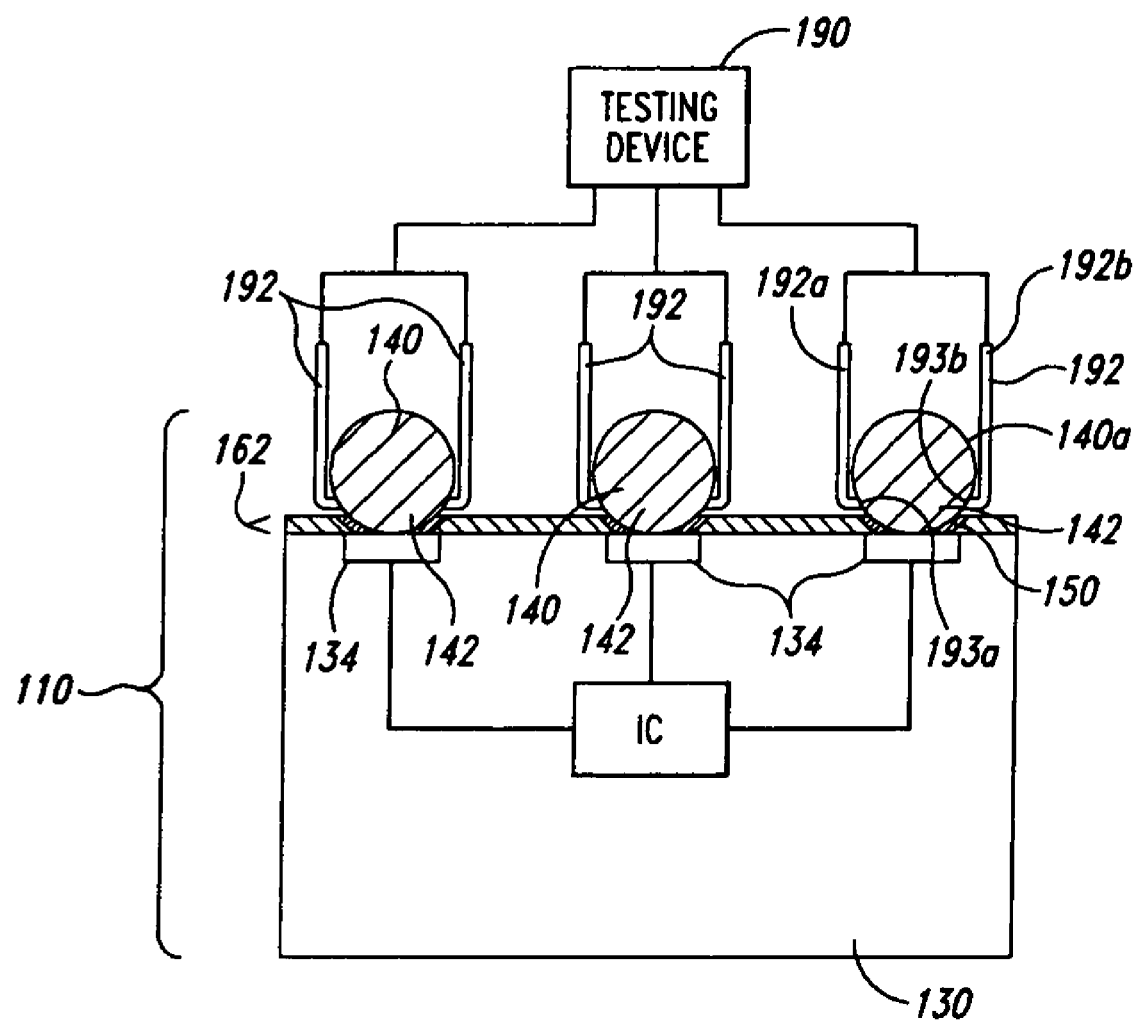

FIG. 2E is a schematic side cross-sectional view of one of the microfeature devices 110 and a testing device 190. After singulation, the microfeature devices 110 can be tested to verify and ensure that the devices 110 function according to specification. The illustrated testing device 190 includes pairs of test contacts 192 for contacting the proximal portion 142 of corresponding conductive balls 140 adjacent to the protective layer 162 and applying electrical signals to test the microfeature device 110. For example, a first test contact 193a includes a first end 193a that contacts a first side of the proximal portion 142 of a conductive ball 140a, and a second test contact 192b includes a second end 193b that contacts a second side of the proximal portion 142 of the conductive ball 140a. In other embodiments, the testing device 190 can test the microfeature devices 110 on the microfeature workpiece 100 (FIG. 2D) before singulation.

One feature of the microfeature devices 110 illustrated in FIGS. 2A–2E is that the coating 150 reduces the extent to which the protective material 160 wicks up the conductive balls 140 to reduce the height of the fillets at the proximal portion 142 of the balls 140. An advantage of this feature is that the elimination of fillets, or at least the reduction in the height of fillets, increases the reliability of the testing process because the test contacts 192 of the testing device 190 can contact the proximal portion 142 of the conductive balls 140 without interference.

C. Additional Embodiments of Methods for Forming a Protective Layer on Microfeature Devices FIGS. 3A and 3B illustrate stages in a method of manufacturing a plurality of microfeature devices 210 on a microfeature workpiece 200 in accordance with another embodiment of the invention. For example, FIG. 3A is a schematic side cross-sectional view of the microfeature workpiece 200 including a coating 250 extending across the workpiece 200. The microfeature workpiece 200 is generally similar to the microfeature workpiece 100 described above with reference to FIGS. 2A–2D. The coating 250 on the workpiece 200, however, covers the conductive balls 140 and the first surface 136 of the dies 130. The coating 250 can be formed on the workpiece 200 by spraying, dipping, atomic layer deposition (ALD), chemical vapor deposition (CVD), physical vapor deposition (PVD), or other suitable processes. After forming the coating 250, the protective material is deposited onto the coating 250 on the first surface 136 to form the protective layer 162. As described above, the surface tension of the coating 250 is less than that of the conductive balls 140 to reduce the extent to which the protective material wicks up the conductive balls 140 and produces fillets at the proximal portion 142 of the balls 140.

FIG. 3B is a schematic side cross-sectional view of the microfeature workpiece 200 with a portion of the coating 250 removed from the conductive balls 140. After forming the protective layer 162, the coating 250 on the exposed areas of the conductive balls 140 is removed to expose the surface of the balls 140 for subsequent attachment and/or testing. The coating 250 on the first surface 136 that is covered by the protective layer 162 may not be removed. The microfeature workpiece 200 can be subsequently cut along the lines A$_2$—A$_2$ to singulate the microfeature devices 210, and the devices 210 can be tested in a process similar to that described above with reference to FIG. 2E.

Figure 4A:
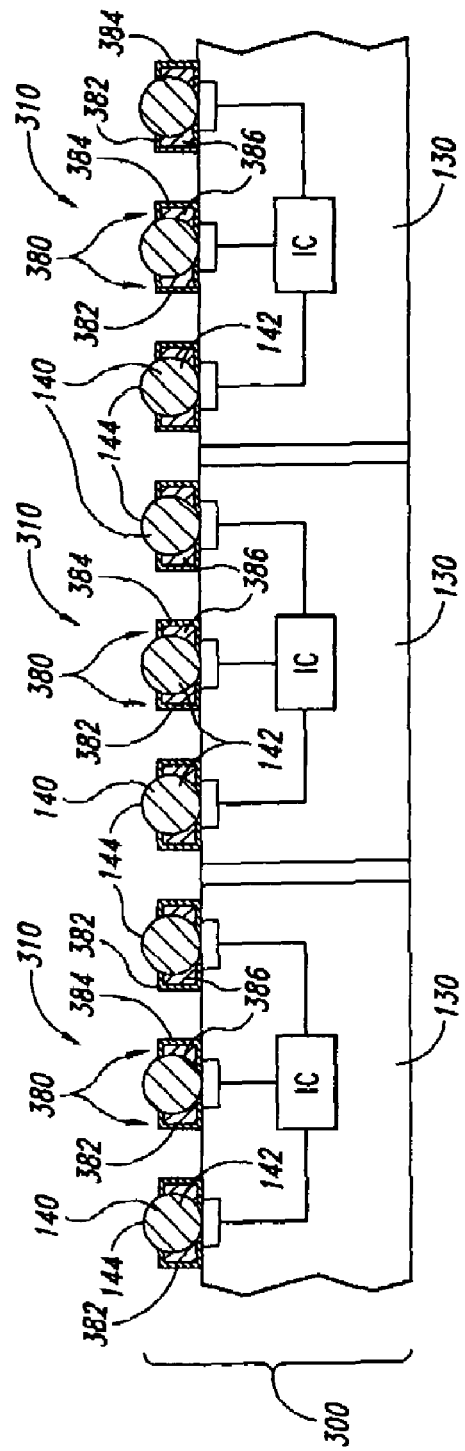
FIGS. 4A and 4B illustrate stages in a method of manufacturing a plurality of microfeature devices on a microfeature workpiece in accordance with another embodiment of the invention.
Figure 4B:
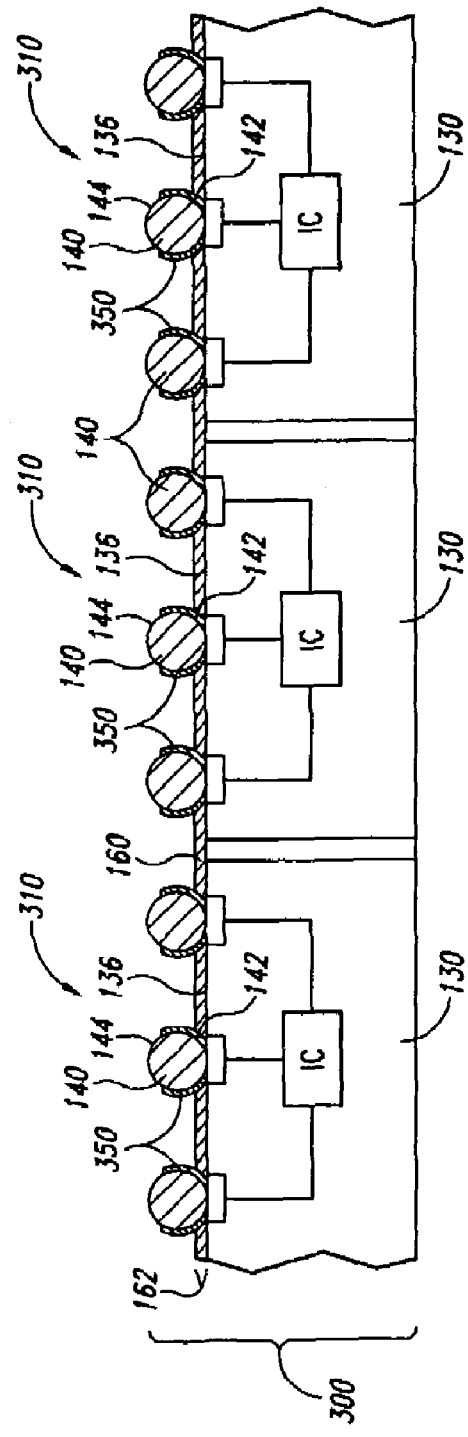

FIGS. 4A and 4B illustrate stages in a method of manufacturing a plurality of microfeature devices 310 on a microfeature workpiece 300 in accordance with another embodiment of the invention. For example, FIG. 4A is a schematic side cross-sectional view of the microfeature workpiece 300 and a plurality of sockets 380 for forming a coating on the conductive balls 140. The microfeature workpiece 300 is generally similar to the microfeature workpiece 100 described above with reference to FIGS. 2A–2D. In the illustrated embodiment, however, the sockets 380 form a coating over the proximal portion 142 of the conductive balls 140 without forming the coating on the distal portion 144 of the balls 140. More specifically, the individual sockets 380 include a first portion 382 and a second portion 384 that selectively clamp together around the proximal portion 142 of the individual conductive balls 140. The first and second portions 382 and 384 include a sponge-like pliant member 386 for carrying the coating material and transferring the material to the conductive balls 140. Accordingly, as the first and second portions 382 and 384 clamp together around the conductive balls 140, the first and second portions 382 and 384 press the pliant member 386 against the surface of the conductive balls 140 to deposit coating material onto the balls 140 and form the coating. The first and second portions 382 and 384 are sized such that the pliant member 386 forms the coating only on the proximal portion 142 of the conductive balls 140.

FIG. 4B is a schematic side cross-sectional view of the microfeature workpiece 300 after forming a coating 350 on the conductive balls 140 and removing the sockets 380 (FIG. 4A). After depositing the coating 350, a protective material is deposited onto the first surface 136 of the dies 130 to form a protective layer 162 across the microfeature workpiece 300. The surface tension of the coating 350 is less than that of the conductive balls 140 to reduce the extent to which the protective material wicks up the conductive balls 140 and produces fillets at the proximal portion 142 of the balls 140. The exposed portion of the coating 350 can subsequently be removed so that the test device 190 (FIG. 2E) can test the microfeature devices 310. In other embodiments, however, the coating 350 may not need to be removed if the coating 350 is sufficiently thin so that the test contacts 192 (FIG. 2E) can apply electrical signals to the conductive balls 140 through the coating 350.

One feature of the microfeature workpiece 300 illustrated in FIGS. 4A–4B is that the coating 350 covers the proximal portion 142 of the conductive balls 140 without covering the distal portion 144 of the balls 140. Because the distal portion 144 of the conductive balls 140 is exposed, the coating 350 does not need to be removed to attach the balls 140 to a substrate or other external device. An advantage of this feature is that the microfeature workpiece 300 may not need to pass through a cleaning process to remove the coating 350 from the conductive balls 140 if the coating 350 is sufficiently thin so that the test contacts 192 can apply electrical signals to the conductive balls 140 through the coating 350. Accordingly, the coating 350 can inhibit the protective material 160 from wicking up the conductive balls 140, without requiring an additional processing step to remove the coating 350 from the balls 140.

D. Additional Embodiments of Methods for Forming an Underfill Layer on Microfeature Devices FIGS. 5A and 5B illustrate stages in a method of manufacturing a plurality of microfeature devices 410 in accordance with another embodiment of the invention. For example, FIG. 5A is a schematic side cross-sectional view of a microfeature workpiece 400 having an underfill layer 462 extending across the first surface 136 of the dies 130. The microfeature workpiece 400 is generally similar to the microfeature workpiece 100 described above with reference to FIGS. 2A–2D. For example, the microfeature workpiece 400 has a plurality of conductive balls 140 and a coating 450 encasing the individual balls 140. The coating 450 can also cover the first surface 136 of the dies 130, as described above with reference to FIGS. 3A and 3B. The microfeature workpiece 400 can be heated to at least partially cure (e.g., B-stage) the coating 450.

After forming the coating 450, an underfill layer 462 is formed across the first surface 136 of the dies 130. The underfill layer 462 can include filler elements 464 to increase the rigidity of the layer 462. The illustrated underfill layer 462 has a thickness T$_2$ from approximately 50 µm to approximately 400 µm and is between approximately 70 and 90 percent of a height H of the conductive balls 140. Alternatively, the thickness T$_2$ of the underfill layer 462 can be less than 70 µm or greater than 400 µm and/or a different percentage of the height H of the conductive balls 140. In any of these embodiments, the surface tension of the coating 450 is less than the surface tension of the conductive balls 140 to reduce the extent to which the underfill material wicks up the conductive balls 140 and covers a distal portion 444 of the balls 140. After forming the underfill layer 462, the microfeature workpiece 400 can be heated to at least partially cure (e.g., B-stage) or solidify the coating 450 and the underfill layer 462.

FIG. 5B is a schematic side cross-sectional view of the microfeature workpiece 400 after removing the coating 450 from the distal portion 444 of the conductive balls 140 so that the balls 140 can be attached to a substrate or other external device. The coating 450 on a proximal portion 442 of the conductive balls 140 may not be removed. After exposing the distal portion 444 of the conductive balls 140, the microfeature workpiece 400 can be cut along the lines A$_3$—A$_3$ to singulate the microfeature devices 410. The microfeature devices 410 can be tested by contacting the distal portion 444 of the conductive balls 140 before and/or after singulation to verify and ensure that the devices 410 function properly.

One feature of the microfeature workpiece 400 illustrated in FIGS. 5A and 5B is that the coating 450 reduces the extent to which the underfill material wicks up the conductive balls 140. An advantage of this feature is that the underfill layer 462 can include dielectric filler elements 464 to increase the rigidity of the layer 462 without the risk that the underfill material will wick up the conductive balls 140 and filler elements 464 will become trapped at the distal portion 444 of the conductive balls 140. If filler elements 464 become trapped at the distal portion 444 of the conductive balls 140, the filler elements 464 can impair the electrical connection between the conductive balls 140 and the substrate or other external device to which the microfeature device 410 is attached. More specifically, when the individual microfeature devices 410 are attached to a substrate, the conductive balls 140 are coupled to corresponding conductive pads on the substrate. If the filler elements 464 become trapped between the conductive balls 140 and the pads, the dielectric filler elements 464 will impair the transmission of electrical signals between the balls 140 and the pads.

Figure 6:
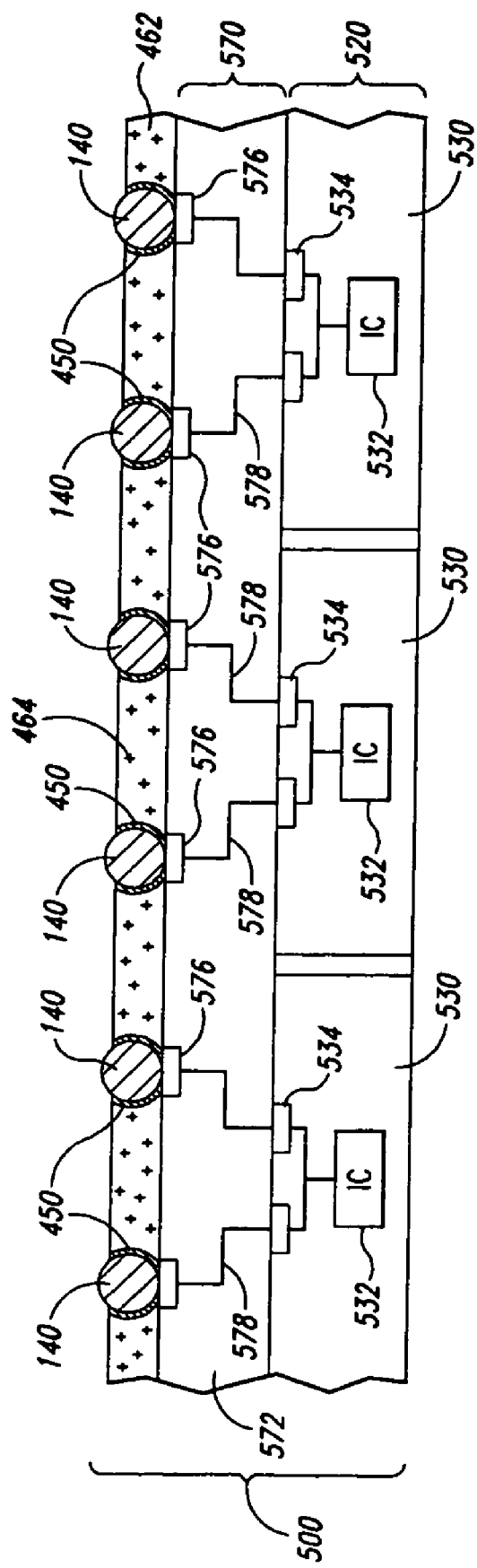
FIG. 6 is a schematic side cross-sectional view of a microfeature workpiece having a substrate and a redistribution layer in accordance with another embodiment of the invention.

FIG. 6 is a schematic side cross-sectional view of a microfeature workpiece 500 having a substrate 520 and a redistribution layer 570 formed on the substrate 520 in accordance with another embodiment of the invention. In the illustrated embodiment, the substrate 520 includes a plurality of microelectronic dies 530 having an integrated circuit 532 (shown schematically) and a plurality of bond-pads 534 coupled to the integrated circuit 532. The redistribution layer 570 includes a dielectric layer 572, a plurality of ball-pads 576 in the dielectric layer 572, and a plurality of conductive lines 578 electrically coupling the bond-pads 534 to corresponding ball-pads 576. The dielectric layer 572 can include several dielectric strata, and the conductive lines 578 can include several conductive layers formed between dielectric strata. The ball-pads 576 are arranged in ball-pad arrays relative to the microelectronic dies 530 such that each die 530 has a corresponding array of ball-pads 576. The microfeature workpiece 500 further includes a plurality of conductive balls 140 on corresponding ball-pads 576, a coating 450 over a portion of the conductive balls 140, and an underfill layer 462 over the redistribution layer 570. The conductive balls 140, the coating 450, and the underfill layer 462 are generally similar to those described above with reference to FIGS. 5A and 5B.

From the foregoing, it will be appreciated that specific embodiments of the invention have been described herein for purposes of illustration, but that various modifications may be made without deviating from the spirit and scope of the invention. For example, the coating 250 shown in FIG. 3A can be used with the underfill layer 462 in the embodiments shown in FIGS. 5A–6, or other elements of any of the foregoing embodiments can be combined with each other in alternative embodiments. Accordingly, the invention is not limited except as by the appended claims.

We claims:

1. A method for manufacturing a microfeature device, the microfeature device having a surface and a plurality of conductive balls on the surface, the individual conductive balls having a proximal portion and a distal portion, the method comprising:
    coating only the proximal portion of the conductive balls of the microfeature device with a film having a surface tension less than a surface tension of the conductive balls, without coating the distal portion of the conductive balls with the film; and
    forming a layer over the surface of the microfeature device after coating the proximal portion of the conductive balls.

2. The method of claim 1 wherein forming the layer comprises depositing a protective layer over the surface of the workpiece.

3. The method of claim 1 wherein forming the layer comprises flowing an underfill onto the surface of the workpiece.

4. The method of claim 1 wherein coating the proximal portion of the conductive balls comprises coating the proximal portion of the conductive balls with Silane.

5. The method of claim 1, further comprising testing the microfeature device by contacting the proximal portion of the individual conductive balls with test contacts.

6. The method of claim 1, further comprising:
    removing the film from at least a portion of the conductive balls; and
    testing the microfeature device by contacting the proximal portion of the individual conductive balls with test contacts.

7. The method of claim 1 wherein coating the proximal portion of the conductive balls comprises clamping a plurality of sockets around the proximal portion of corresponding conductive balls.

8. The method of claim 1 wherein the layer has a surface tension greater than the surface tension of the film.

9. A method for manufacturing a microfeature workpiece, the microfeature workpiece having a surface and a plurality of conductive interconnect elements projecting from the surface, the method comprising:
    forming a coating on only a proximal portion of the individual conductive interconnect elements of the microfeature workpiece, the coating having a surface tension less than a surface tension of the conductive interconnect elements; and
    placing a layer over the surface of the microfeature workpiece after forming the coating on the proximal portion of the individual conductive interconnect elements.

10. The method of claim 9 wherein placing the layer comprises depositing a protective layer over the surface of the workpiece.

11. The method of claim 9 wherein placing the layer comprises flowing an underfill onto the surface of the workpiece.

12. The method of claim 9, further comprising testing the microfeature workpiece by contacting the individual conductive interconnect elements with test contacts.

13. The method of claim 9 wherein the conductive interconnect elements comprise a plurality of conductive balls, and wherein forming the coating comprises disposing the coating on only a proximal portion of the individual conductive balls.

14. The method of claim 9 wherein forming the coating comprises clamping a plurality of sockets around the proximal portion of corresponding conductive interconnect elements.

15. A method for manufacturing a microfeature workpiece, the microfeature workpiece having a surface and a plurality of conductive elements arranged in arrays on the surface, the individual conductive elements having a proximal portion proximate to the surface and a distal portion opposite the proximal portion, the method comprising:
    without coating the distal portion of the individual conductive elements, forming a first coating on the proximal portion of the individual conductive elements of the microfeature workpiece to inhibit a second coating from wicking up the conductive elements; and
    disposing the second coating over the surface of the microfeature workpiece after forming the first coating.

16. The method of claim 15 wherein forming the first coating on the proximal portion of the individual conductive elements comprises coating only the proximal portion of the individual conductive elements of the microfeature workpiece.

17. The method of claim 15 wherein the first coating has a first surface tension, and wherein the conductive elements have a second surface tension greater than the first surface tension.

18. The method of claim 15 wherein disposing the second coating comprises depositing a protective layer over the surface of the workpiece.

19. The method of claim 15 wherein disposing the second coating comprises flowing an underfill onto the surface of the workpiece.

20. The method of claim 15, further comprising testing the microfeature workpiece by contacting the individual conductive elements with test contacts.

* * * * *